US011316063B2

(12) United States Patent
Roy et al.

(10) Patent No.: US 11,316,063 B2
(45) Date of Patent: Apr. 26, 2022

(54) DIODE DEVICES AND METHODS OF FORMING A DIODE DEVICE

(71) Applicant: GLOBALFOUNDRIES Singapore Pte. Ltd., Singapore (SG)

(72) Inventors: Sandipta Roy, Singapore (SG); Khee Yong Lim, Singapore (SG); Lanxiang Wang, Singapore (SG); Kiok Boone Elgin Quek, Singapore (SG); Jing Hua Michelle Tng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/817,691

(22) Filed: Mar. 13, 2020

(65) Prior Publication Data

US 2021/0288205 A1    Sep. 16, 2021

(51) Int. Cl.
| | |
|---|---|
| *H01L 31/10* | (2006.01) |
| *H01L 31/107* | (2006.01) |
| *H01L 31/18* | (2006.01) |
| *H01L 29/66* | (2006.01) |
| *H01L 29/861* | (2006.01) |
| *H01L 29/864* | (2006.01) |
| *H01L 21/02* | (2006.01) |

(52) U.S. Cl.
CPC ...... *H01L 31/107* (2013.01); *H01L 21/02417* (2013.01); *H01L 21/02568* (2013.01); *H01L 29/6609* (2013.01); *H01L 29/66113* (2013.01); *H01L 29/66159* (2013.01); *H01L 29/861* (2013.01); *H01L 29/864* (2013.01); *H01L 31/1075* (2013.01); *H01L 31/18* (2013.01)

(58) Field of Classification Search
CPC ............ H01L 31/107; H01L 21/02568; H01L 21/02417; H01L 29/66113; H01L 29/66159; H01L 31/1075; H01L 29/864; H01L 31/18; H01L 29/6609; H01L 29/861
See application file for complete search history.

(56) References Cited

U.S. PATENT DOCUMENTS

| | | | |
|---|---|---|---|
| 2003/0047750 A1* | 3/2003 | Russ | H01L 29/7378 257/173 |
| 2013/0040417 A1* | 2/2013 | Janesick | H01L 27/14643 438/73 |

(Continued)

OTHER PUBLICATIONS

Pan et al., "Enhanced visible and near-infrared optical absorption in silicon supersaturated with chalcogens", Applied Physics Letters, Mar. 23, 2011, 4 pages, vol. 98.

(Continued)

*Primary Examiner* — Charles D Garber
*Assistant Examiner* — S M Sohel Imtiaz
(74) *Attorney, Agent, or Firm* — Viering Jentschura & Partner MBB

(57) ABSTRACT

According to various embodiments, there is provided a diode device including a semiconductor substrate of a first conductivity type, a first semiconductor region formed within the semiconductor substrate, an epitaxial region of the first conductivity type, and a second semiconductor region of a second conductivity type different from the first conductivity type. The first semiconductor region includes a chalcogen. The epitaxial region is formed over the first semiconductor region. The second semiconductor region is formed over the epitaxial region.

20 Claims, 12 Drawing Sheets

(56) References Cited

U.S. PATENT DOCUMENTS

| | | | |
|---|---|---|---|
| 2013/0193546 A1* | 8/2013 | Webster | H01L 31/18 |
| | | | 257/438 |
| 2015/0200247 A1* | 7/2015 | Schmidt | H01L 21/324 |
| | | | 257/140 |
| 2016/0218236 A1* | 7/2016 | Dhulla | H01L 27/1443 |
| 2019/0055668 A1* | 2/2019 | Zhang | H01L 29/24 |
| 2019/0312070 A1* | 10/2019 | Piemonte | H01L 31/02027 |
| 2020/0028018 A1* | 1/2020 | Iwata | H01L 31/02027 |
| 2020/0105958 A1* | 4/2020 | Sasago | H01L 31/107 |

OTHER PUBLICATIONS

Zhou et al., "Hyperdoping silicon with selenium: solid vs. liquid phase epitaxy", Scientific Reports, Feb. 9, 2015, pp. 1-7, vol. 5.
Berencen et al., "Room-temperature shortwavelength infrared Si photodetector", Scientific Reports, Mar. 6, 2017, pp. 1-9, vol. 7.
Aull et al., "Large-Format Geiger-Mode Avalanche Photodiode Arrays and Readout Circuits", IEEE Journal of Selected Topics in Quantum Electronics, 2018, 10 pages, vol. 24, No. 2, IEEE.

* cited by examiner

DIODE DEVICES AND METHODS OF FORMING A DIODE DEVICE

TECHNICAL FIELD

Various embodiments relate to diode devices and methods of forming a diode device.

BACKGROUND

A single photon avalanche photodiode (SPAD) may be capable of generating an electrical signal in response to very low intensity of light, such as even a single photon. Also, the SPAD may be highly responsive such that the time of incidence of the light can be accurately tracked. However, SPADs fabricated out of silicon, cannot absorb light waves having a wavelength of more than 1.1 um, due to the intrinsic characteristics of silicon. As such, the applications of the prior art SPADs are limited to detecting low wavelength light.

SUMMARY

According to various embodiments, there may be provided a diode device. The diode device may include a semiconductor substrate of a first conductivity type, a first semiconductor region formed within the semiconductor substrate, an epitaxial region of the first conductivity type, and a second semiconductor region of a second conductivity type different from the first conductivity type. The first semiconductor region may include a chalcogen. The epitaxial region may be formed over the first semiconductor region. The second semiconductor region may be formed over the epitaxial region.

According to various embodiments, there may be provided a method of forming a diode device. The method may include providing a first semiconductor region within a semiconductor substrate of a first conductivity type. The method may include implanting the first semiconductor region with a chalcogen. The method may include forming an epitaxial region of the first conductivity type, over the first semiconductor region, and forming a second semiconductor region of a second conductivity type over the epitaxial region. The second conductivity type may be different from the first conductivity type.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
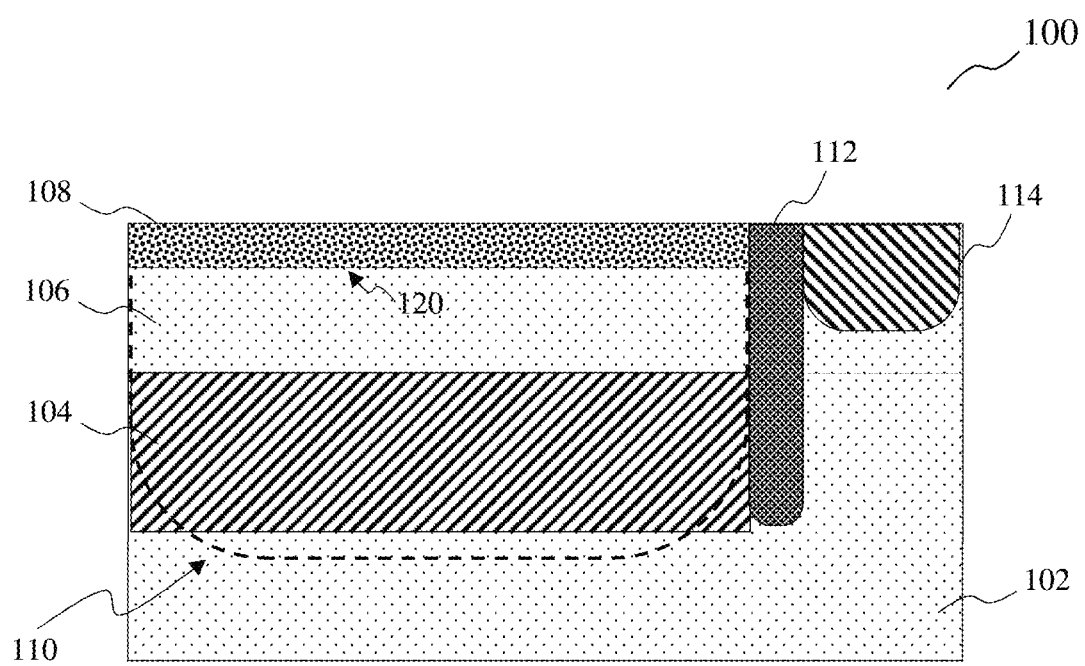
FIG. 1 shows a cross-sectional view of a diode device according to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

In order that the invention may be readily understood and put into practical effect, various embodiments will now be described by way of examples and not limitations, and with reference to the figures.

A conventional silicon photodiode device is unable to detect light beyond 1.1 um, as silicon cannot absorb light beyond 1.1 um in wavelength. It may be possible to adapt a silicon photodiode device to detect light of more than 1.1 um in wavelength, by doping the silicon material in the photodiode device with chalcogens. Introducing non-equilibrium deep-level dopant concentrations of the chalcogens into silicon results in the formation of an impurity band that allows for strong sub-band gap absorption. However, the doping of chalcogens into the silicon material increases the defect density of the silicon material, which increases the dark count rate of the photodiode device.

A diode device according to various embodiments may be able to detect light having wavelength of up to 1.55 um, while achieving a low dark count rate. The diode device may include a doped silicon region that includes one or more chalcogen such as selenium, tellurium or sulphur. The doped silicon region may be a generation region of the diode device that releases free carriers upon absorption of photos. The doped silicon region may be separated from the p-n junction, as well as the avalanche region of the diode device, by an intermediate region. The intermediate region may be formed by growing an epitaxial layer over the doped silicon region. Although the doped silicon region may have a high defect density, the dark count rate of the diode device may be kept low as the generation region is isolated from direct contact with the avalanche region.

FIG. 1 shows a cross-sectional view of a diode device 100 according to various embodiments. The diode device 100 may include a semiconductor substrate 102. The semiconductor substrate 102 may be of a first conductivity type. The semiconductor substrate 102 may include silicon, for example, bulk silicon, or silicon-on-insulator (SOI). The diode device 100 may include a first semiconductor region 104 formed within, or over, the semiconductor substrate 102. The first semiconductor region 104 may include one or more chalcogens, such as selenium, tellurium or sulphur. The first semiconductor region 104 may be formed by implanting the one or more chalcogens in a region of the semiconductor substrate 102. The first semiconductor region 104 may be a hyper-doped region. The first semiconductor region 104 may be of the first conductivity type. The diode device 100 may include an epitaxial region 106. The epitaxial region 106 may be of the first conductivity type. The epitaxial region 106 may be formed over the first semiconductor region 104. The epitaxial region 106 may be adjacent to, and in contact with, the first semiconductor region 104. The diode device 100 may include a second semiconductor region 106. The second semiconductor region 108 may be formed over the epitaxial region 106. The second semiconductor region 108 may be adjacent to, and in contact with, the epitaxial region 106. The second semiconductor region 108 may be of a second conductivity type that is different from the first conductivity type. The first conductivity type may be N-type and the second conductivity type may be P-type. As a result of the opposing conductivity types of the second semiconductor region 108 and the epitaxial region 106, the interface between these two regions may form a p-n junction 120 of the diode device 100. The first semiconductor region 104 and the epitaxial region 106 may be configured to form a depletion region 110, also referred to as depletion zone, of the diode device 100. The first semiconductor region 104 and a top part of the epitaxial region 106 may be doped to respective concentration levels such that the holes and free electrons within these regions recombine to form the depletion region 110 that is void of any carriers, when a bias voltage is applied across the first semiconductor region 104 and the epitaxial region 106. The top part of the epitaxial region 106 that is doped may form the second semiconductor region 108.

The diode device 100 may further include an isolation region 112. The isolation region 112 may be a deep trench isolation (DTI) or a shallow trench isolation (STI). The isolation region 112 may be arranged adjacent to each of the second semiconductor region 108, the epitaxial region 106 and the first semiconductor region 104. The isolation region 112 may be formed at least partially within the semiconductor substrate 102. The diode device 100 may further include a well region 114. The well region 114 may be formed adjacent to the isolation region 112. The well region 114 may be of the first conductivity type. The well region 114 may be formed at least partially within the epitaxial region 106. The region 110 may be fully or partially covered by the first semiconductor region 104.

According to various embodiments, the diode device 100 may be an avalanche photodiode. The diode device 100 may be a single-photon avalanche diode (SPAD). The diode device 100 may be configured to operate in the Geiger mode for photon counting. The p-n junction 120 may be reverse biased above its breakdown voltage such that a single photon incident on an active device area may create an electron-hole pair and thereby trigger an avalanche of secondary carriers. The photons may be absorbed by the first semiconductor region 104. The first semiconductor region 104, also referred herein as a generation region, may release charge carriers upon absorption of the photons. The charge carriers from the first semiconductor region 104 may travel across the epitaxial region 106 to reach the second semiconductor region 108. The second semiconductor region 108, also referred herein as an avalanche region, may release the avalanche of secondary carriers in response to the release of charge carriers from the first semiconductor region 108. The time taken to trigger the avalanche of secondary carriers may be very short, such as in the order of picoseconds, such that the associated change in voltage across the diode device 100 may be used to precisely measure the time of the arrival of the photon. The operation of the diode device 100 will be described in further details with respect to FIGS. 3 and 4.

The generation region may be implanted with impurities so that the diode device 100 may be capable of absorbing light having wavelength of more than 1.1 um. The impurities may include chalcogens. In other words, the generation region may be hyper-doped with chalcogens. The diode device 100 may be capable of achieving a low dark count rate in spite of the defects introduced by the doping, as the generation region (i.e. the first semiconductor region 104) is separated from the avalanche region (i.e. the second semiconductor region 108). In other words, the generation region is separated from the p-n junction 120.

According to various embodiments, the diode device 100 may be configured to generate an electrical current in response to receiving photons incident through the second semiconductor region 108, in other words, illumination received from a front-side of the diode device 100. An external circuit may transform the generated current into a voltage.

According to various embodiments, the diode device 100 may be configured to generate an electrical current in response to receiving photons incident through the semiconductor substrate 102, in other words, illumination received from a back-side of the diode device 100. An external circuit may transform the generated current into a voltage.

Figure 2A:
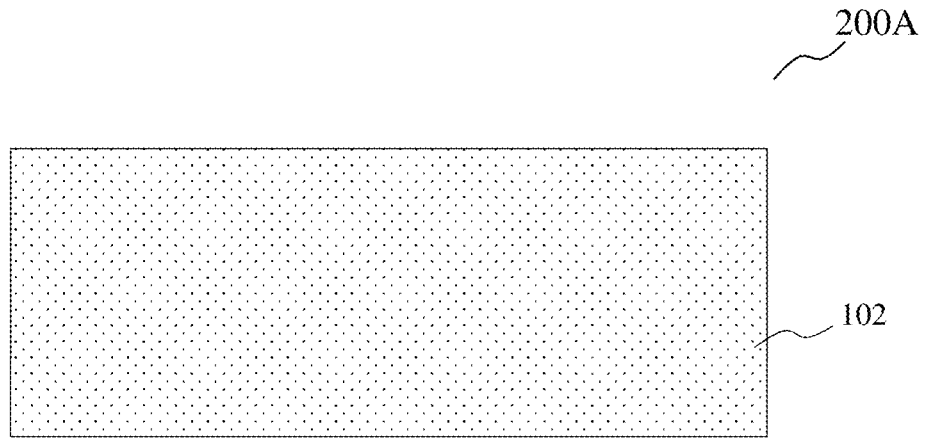
FIGS. 2A to 2E show a method of forming a diode device according to various embodiments.

FIGS. 2A to 2E show a method of forming a diode device 100 according to various embodiments. FIG. 2A shows a process 200A. The process 200A may include providing a semiconductor substrate 102.

Figure 2B:
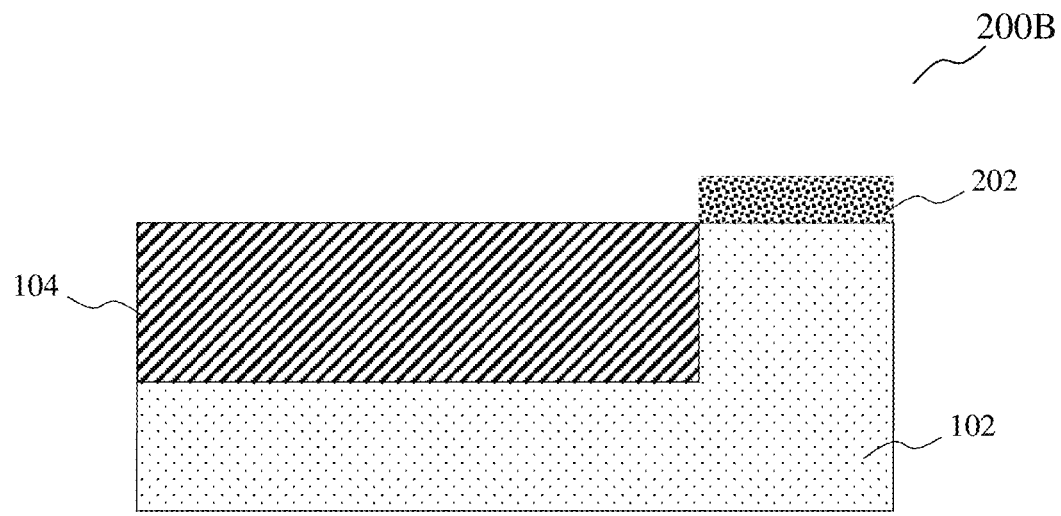

FIG. 2B shows a process 200B. The process 200B may include forming a mask 202 over part of semiconductor substrate 102. The process 200B may also include doping a region of the semiconductor substrate 102 that is not covered by the mask 202 with one or more chalcogens. As a result of the implantation, part of the semiconductor substrate 102 may be hyper-doped to form the first semiconductor region 104.

Figure 2C:
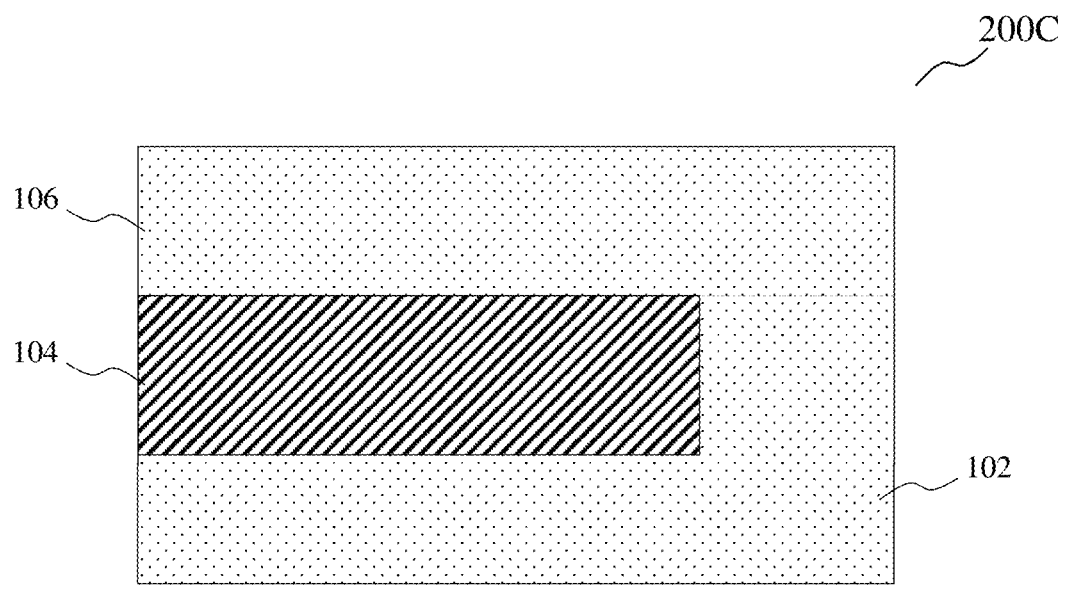

FIG. 2C shows a process 200C. The process 200C may include removing the mask 202 and growing the epitaxial region 106 over the first semiconductor region 104 and the semiconductor substrate 102. The process 200C may include depositing a semiconductor material over the first semiconductor region 104 and part of the semiconductor substrate 102. The deposited semiconductor material may be heated so that it takes on a lattice structure or orientation to form the epitaxial region 106. The epitaxial region 106 may also be formed by high temperature epitaxy growth.

Figure 2D:
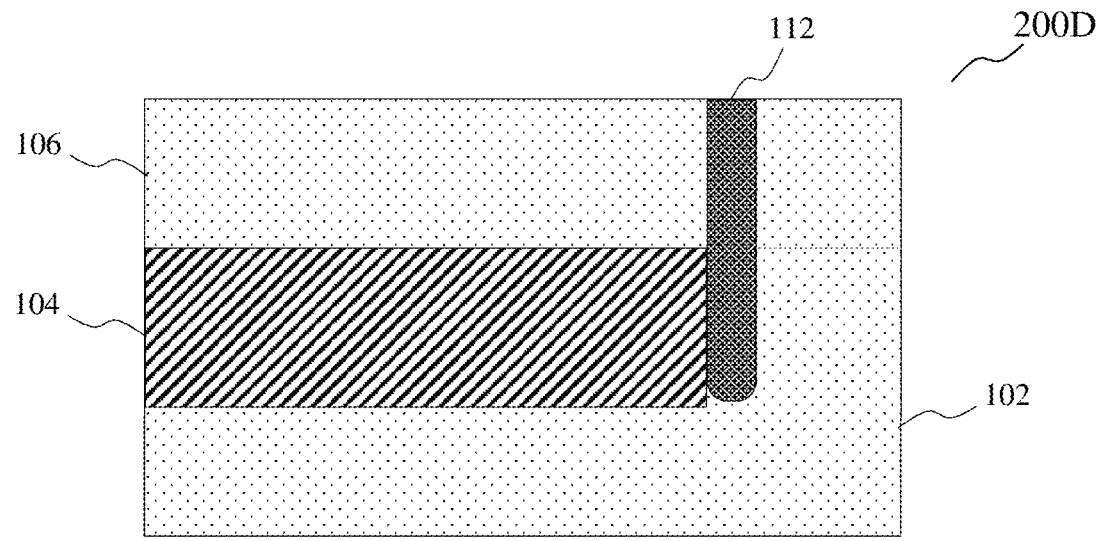

FIG. 2D shows a process 200D. The process 200D may include forming an isolation region 112. The isolation region 112 may be at least partially arranged within the epitaxial region 106. The isolation region 112 may extend through an entire thickness of the epitaxial region 106. The isolation region 112 may further extend into the semiconductor substrate 102, beside the first semiconductor region 104. In other words, at least part of the isolation region 112 may be adjacent to the first semiconductor region 104.

Figure 2E:
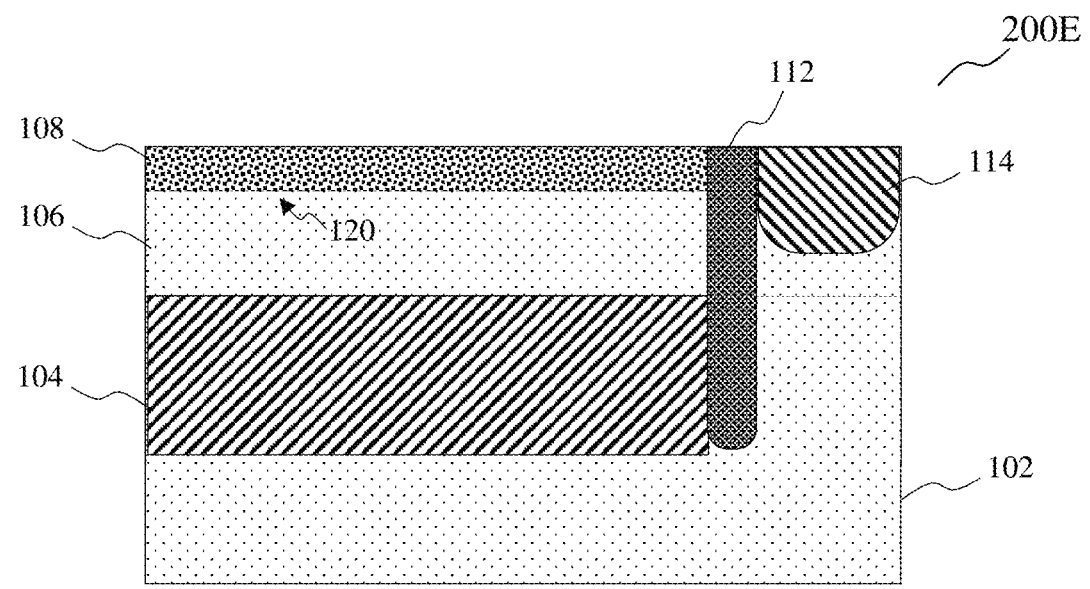

FIG. 2E shows a process 200E. The process 200E may include forming the second semiconductor region 108 over the epitaxial region 106, by in-situ epitaxial growth. By forming the semiconductor region 108 that has an opposite conductivity type from the epitaxial region 106, the process 200E thereby also forms the p-n junction 120. An avalanche of electron-hole pair happens in the second semiconductor region 108 when the applied reverse bias is greater than the breakdown voltage of the p-n junction 120. The process 200E may also include forming a well region 114 in the semiconductor substrate 102, adjacent to the isolation region 112. Forming the well region 114 may include doping a region of the epitaxial region 106 or a region of the semiconductor substrate 102 that lies adjacent to the isolation region 112.

Figure 3:
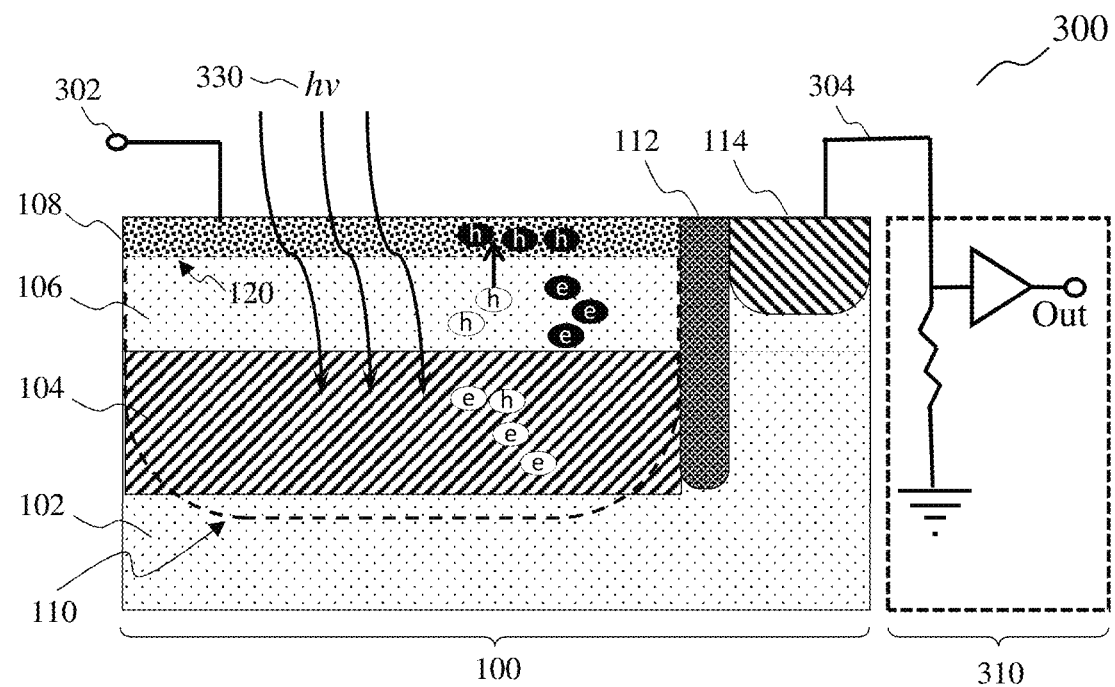
FIG. 3 shows a simplified schematic view of a photodetector device according to various embodiments.

FIG. 3 shows a simplified schematic view of a photodetector device 300 according to various embodiments. Operation of the photodetector device 300 is described herein with respect to FIG. 3. The photodetector device 300 may include the diode device 100 and an electronic signal processing circuit 310. The photodetector device 300 may measure illumination received on a front-side of the diode device 100, in other words, light received through the second semiconductor region 108. The photodetector device 300 may include voltage supply connectors. A first voltage supply connector 302 may be connected to the second semiconductor region 108. A second voltage supply connector 304 may connect the well region 114 to the electronic signal processing circuit 310. To operate the photodetector device 300, the first voltage supply connector 302 may supply a high voltage, for example, a negative voltage of a large magnitude, to the second semiconductor region 108, so as to reverse bias the p-n junction 120 above its breakdown voltage. When a photon 330 (indicated as hv in FIG. 3) is incident onto the diode device 100 from the front-side, the photon 330 may pass through the second semiconductor region 108 and the epitaxial region 106 to reach the first semiconductor region 104. The photon 330 may provide energy to free a pair of electron and hole in the first semiconductor region 104. The generated hole may travel through the epitaxial region 106 to reach the second semiconductor region 108. The free electrons and holes generated in the first semiconductor region 104 are referred herein as primary carriers. The primary carriers are represented in FIG. 3 as white ellipses. In FIG. 3, electrons and holes are labeled as "e" and "h" respectively. The first semiconductor region 104 is referred herein as the generation region. The generated holes that enter the second semiconductor region 108 through the p-n junction 120 may energize the second semiconductor region 108 to free further electrons and holes in the second semiconductor region 108. The free electrons and holes generated in second semiconductor region 108 are referred herein as secondary carriers. The secondary carriers are represented in FIG. 3 as black ellipses. The p-n junction 120 inside the second semiconductor region 108 is referred herein as the avalanche region. The secondary carriers may generate a current, which may be converted to a voltage by the electronic signal processing circuit 310. The change in the voltage may be directly proportional to the intensity of the illumination incident onto the diode device 100. The electronic processing circuit 310 may measure the intensity of the illumination based on the change in the voltage.

Figure 4:
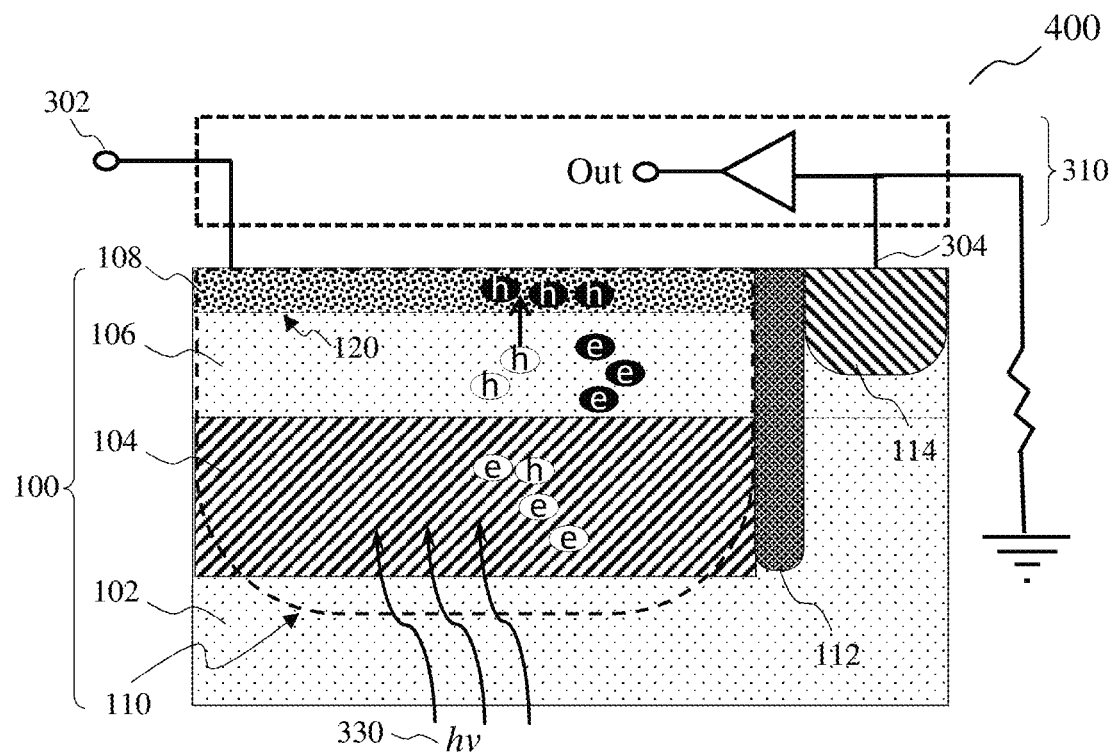
FIG. 4 shows a simplified schematic view of a photodetector device according to various embodiments.

FIG. 4 shows a simplified schematic view of a photodetector device 400 according to various embodiments. The photodetector device 400 may include the diode device 100 and an electronic signal processing circuit 310. Operation of the photodetector device 400 may be similar to the photodetector device 300, except that the photodetector device 400 may measure illumination received on a back-side of the diode device 100, in other words, light received through the semiconductor substrate 102. The electronic signal processing circuit 310 may be provided over the front-side of the diode device 100.

Figure 5A:
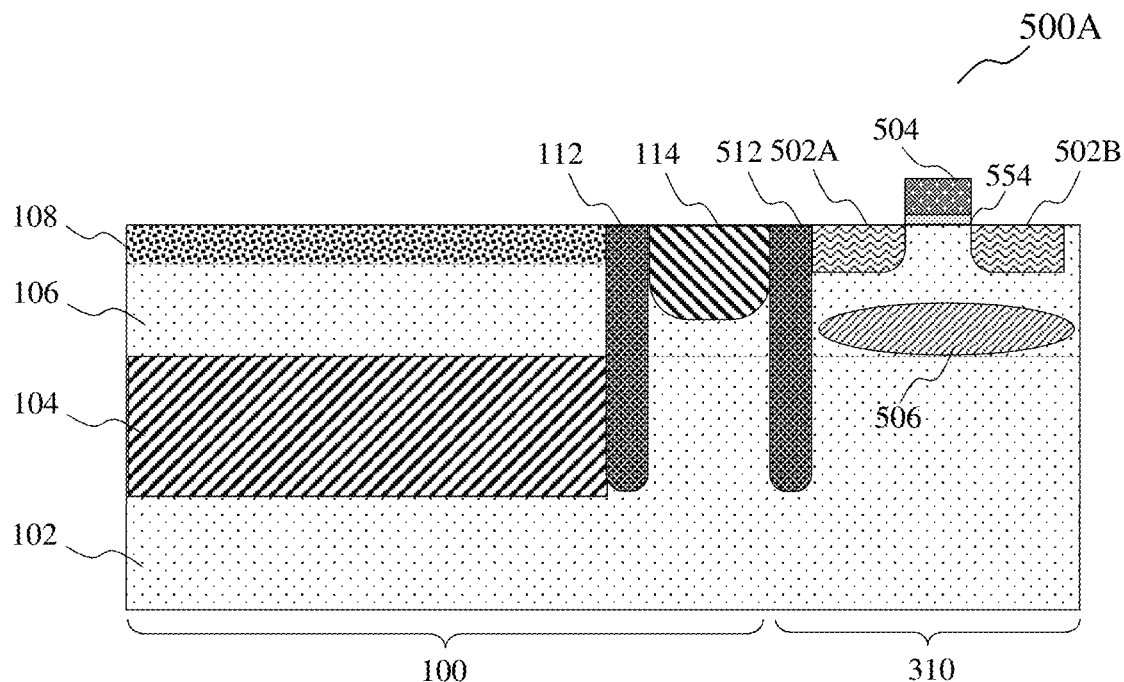
FIGS. 5A to 5C show a method of forming a photodetector device according to various embodiments.
Figure 5B:
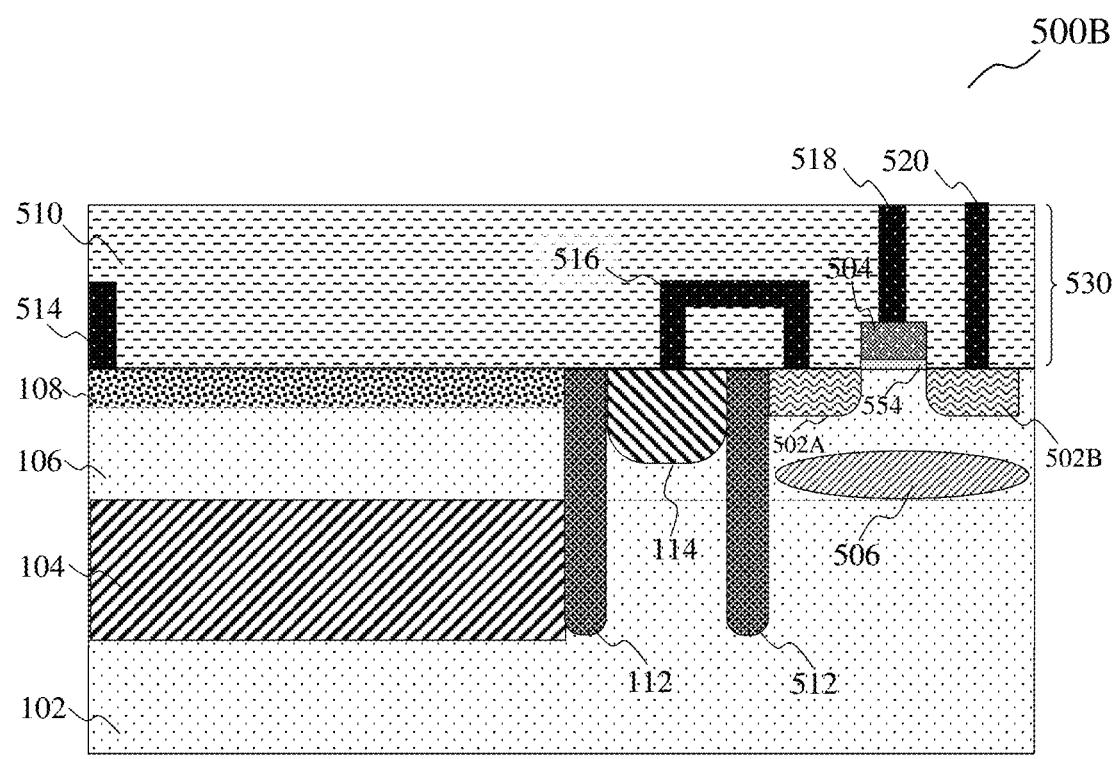
Figure 5C:
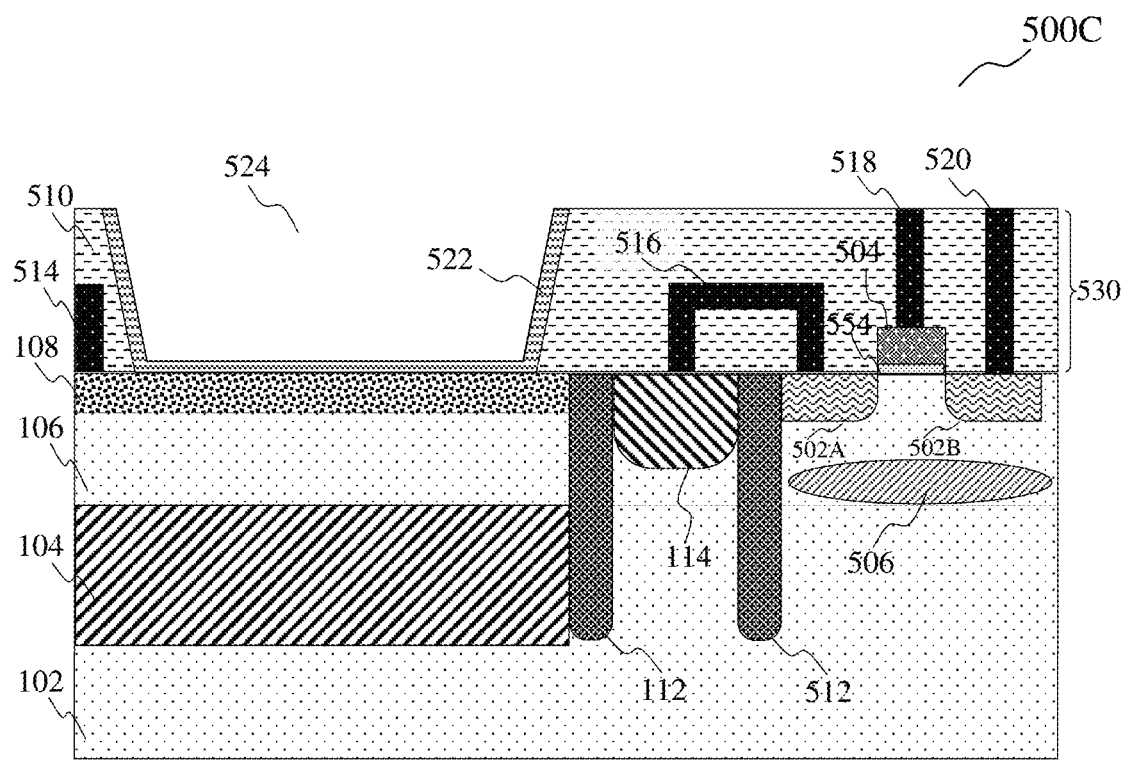

FIGS. 5A to 5C show a method of forming a photodetector device according to various embodiments. The photodetector device may include the photodetector device 300. The starting structure for forming the photodetector device may be the diode device 100.

FIG. 5A shows a process 500A. The process 500A may include fabricating a circuit. The circuit may be the signal processing circuit 310. The process 500A may include forming a further isolation region 512 adjacent to the well region 114. The further isolation region 512 may be arranged adjacent to a first side of the well region 114, the first side being opposite to a second side of the well region 114 that is adjacent to the isolation region 112. The well region 114 may be in between the isolation region 112 and the further isolation region 512. The further isolation region 512 may be a STI or a DTI. The further isolation region 512 may electrically isolate the circuit from the diode device 100. The circuit may include a further well region 506 of a second conductivity type, i.e. of an opposite conductivity type from the well region 114. The further well region 506 may be provided adjacent to the further isolation region 512. The further well region 506 may be provided deeper in the epitaxial region 106, as compared to the well region 114. The circuit may include a transistor. The transistor may be a metal-oxide-semiconductor field-effect transistor (MOSFET). The transistor may include a source terminal 502A, a drain terminal 502B and a gate terminal 504. The source terminal and the drain terminal may be interchangeable. The source terminal 502A and the drain terminal 502B may be formed by ion implantation, followed by localized annealing. The gate terminal 504 may be formed over a thin oxide region 554. Forming the gate terminal 504 may include depositing polysilicon over the thin oxide region 554. The source terminal 502A and the drain terminal 502B may be formed within the semiconductor substrate 102.

FIG. 5B shows a process 500B. The process 500B may include forming the back end of line (BEOL) layer 530 of the photodetector device. The BEOL layer 530 may include a dielectric layer 510. The dielectric layer 510, also referred herein as a dielectric region, may be formed over each of the second semiconductor region 108, the isolation region 112, the further isolation region 512, and the well region 114. The BEOL layer 530 may also include a plurality of metal interconnect structures embedded in the dielectric layer 510. The plurality of metal interconnect structures may include a first metal contact 514 connected to the second semiconductor region 108. The first metal contact 514 may include, or may be part of, the first voltage supply connector 302 shown in FIG. 3. The plurality of metal interconnect structures may include a second metal contact 516. The second metal contact 516 may have a first end connected to the well region 114, and may have a second end opposite to the first end, that is connected to the source terminal 502A. The second metal contact 516 may include, or may be part of, the second voltage supply connector 304. The plurality of metal interconnect structures may include a third metal contact 518 and a fourth metal contact 520. The third metal contact 518 may be connected to the electrical contact 504 of the circuit. The fourth metal contact 520 may be connected to the drain terminal 502B. The third metal contact 518 and the fourth metal contact 520 may serve to connect the photodetector device to an external device. The third metal contact 518 and the fourth metal contact 520 may connect an output of the circuit to an external device.

FIG. 5C shows a process 500C. The process 500C may include forming a cavity 524 in the BEOL layer 530. The cavity 524 may be formed by etching away a portion of the dielectric layer 510 that lies at least partially above the second semiconductor region 108. The cavity 524 may overlap the second semiconductor region 108. The cavity 524 may define an active area of the photodetector device. The active area may serve as a receptacle for incident light. The photodetector device may be configured to measure the intensity of light that is shone onto the active area. The process 500C may further include depositing an anti-reflection material to form an anti-reflection coating 522 over an inner surface of the cavity 524. The anti-reflection coating 522 may improve the accuracy of the photodetector device by minimizing reflection of the photons away from the active area. In other words, the anti-reflection coating 522 may improve absorption of the photons into the diode device within the photodetector device. The anti-reflection coating 522 may include an at least partially transparent dielectric material, for example, one or more of silicon nitride, silicon dioxide or combinations thereof.

FIGS. 6A to 6E show a method of forming a photodetector device according to various embodiments. The photodetector device may include the photodetector device 400. The starting structure for forming the photodetector device may be the diode device 100.

Figure 6A:
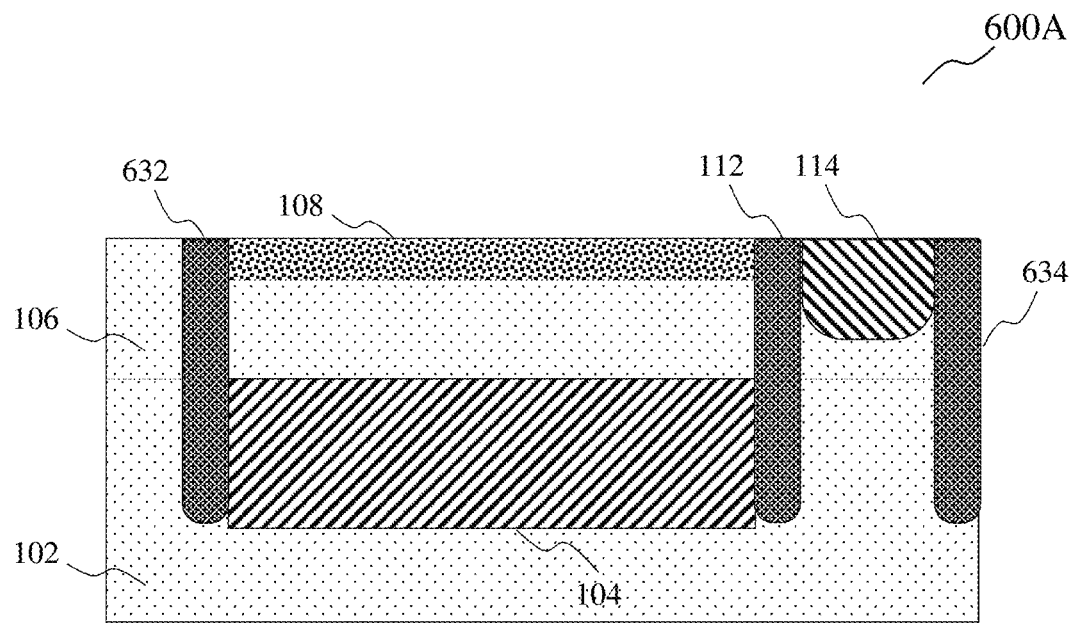
FIGS. 6A to 6E show a method of forming a photodetector device according to various embodiments.

FIG. 6A shows a process 600A. The process 600A may include forming a first further isolation region 632 at least partially in the semiconductor substrate 102 and at least partially in the epitaxial region 106. The first further isolation region 632 may be adjacent to each of the first semiconductor region 104, the epitaxial region 106, and the second semiconductor region 108. The process 600A may include forming a second further isolation region 634 at least partially in the semiconductor substrate 102 and at least partially in the epitaxial region 106. The second further isolation region 634 may be adjacent to the well region 114. The first further isolation region 632 and the second further isolation region 634 may be arranged on opposite ends of the diode device 100, and may serve to electrically insulate the diode device. The first further isolation region 632 and the second further isolation region may be STIs or DTIs.

Figure 6B:
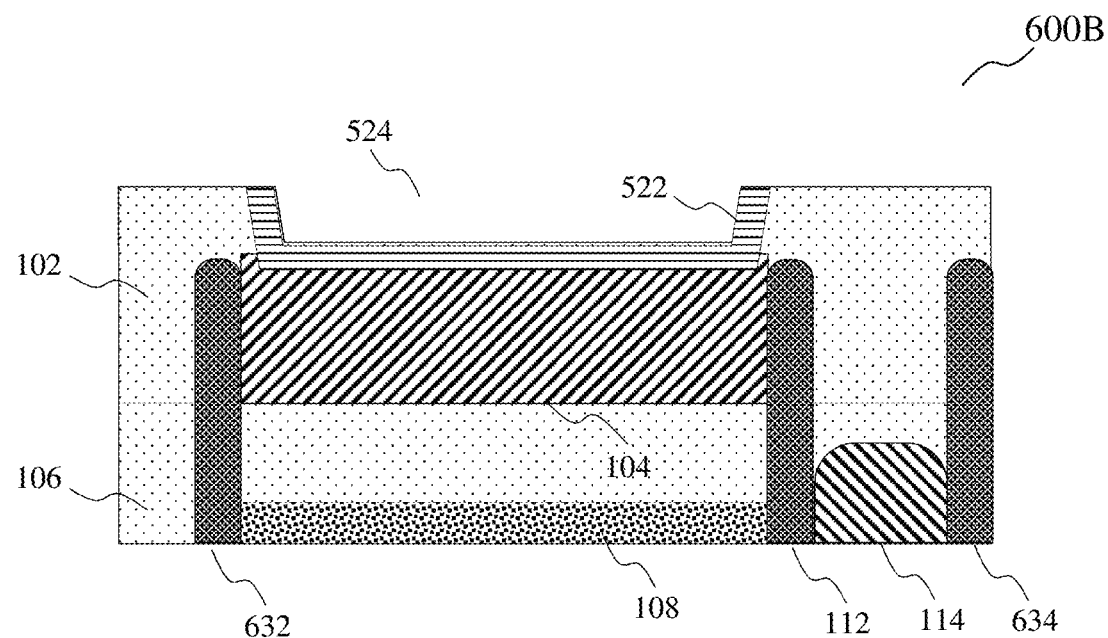

FIG. 6B shows a process 600B. The process 600B may include flipping the device resulting from the process 600A, and forming a cavity 524 in the semiconductor substrate 102. The cavity 524 may be formed by etching the diode device at the backside. The cavity 524 may lie directly above the first semiconductor region 104 when the device is flipped as shown in FIG. 6B. An anti-reflection coating 522 may be formed on an inner surface of the cavity 524, similar to the process 500C.

Figure 6C:
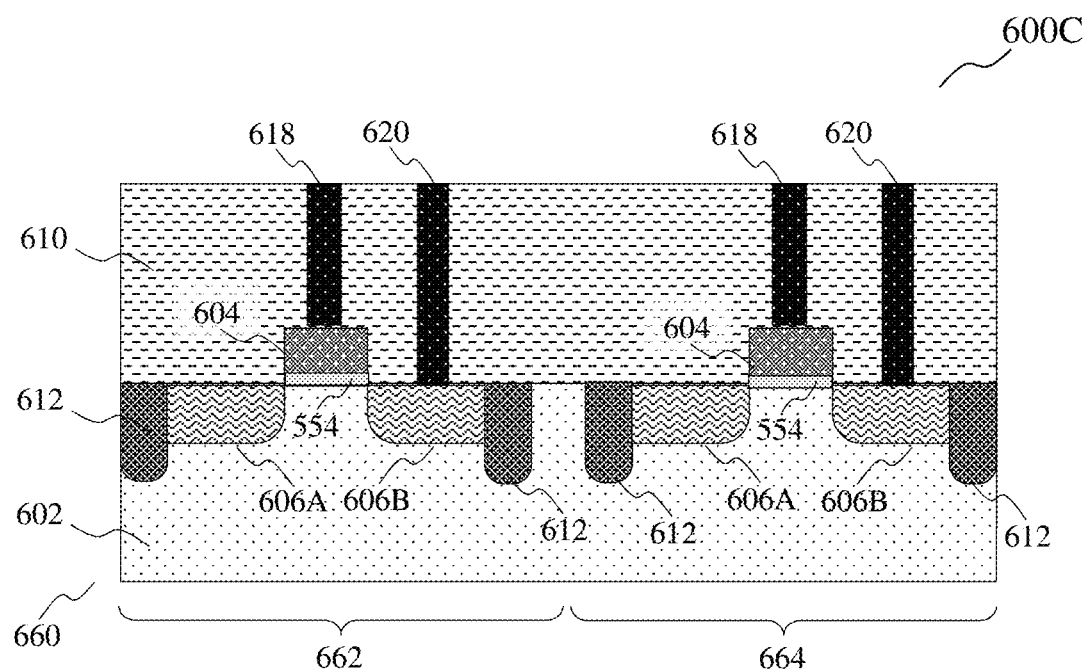

FIG. 6C shows a process 600C that may include fabricating a circuit. The circuit may include one or more logic circuits. The circuit may be part of, or may include, the signal processing circuit 310. Unlike the process 500A, the process 600C fabricates the circuit on a wafer 660 that is separate from the diode device 100, instead of onto the wafer that includes the diode device 100. The wafer 660 may include a substrate 602 and a dielectric layer 610 formed over the substrate 602. The circuit may include a first sub-circuit 662. The first sub-circuit 662 may include a pair of isolation regions 612 and a transistor. The transistor may be a MOSFET. The transistor may include a source terminal 606A, a drain terminal 606B and a gate terminal 604. The source terminal 606A and the drain terminal 606B may be interchangeable. Each of the source terminal 606A and the drain terminal 606B may be adjacent to a respective isolation region 612. The gate terminal 604 may be arranged within the dielectric layer 610, directly above a thin oxide region 554 $t$. The first sub-circuit 662 may further include a first metal contact 618 that is connected to the gate terminal 604, and a second metal contact 620 that is connected to the drain terminal 606B. The circuit may further include a second sub-circuit 664 that is identical to the first sub-circuit 662. The circuit may include other sub-circuits, for example, a measurement sub-circuit configured to measure or read an output signal generated by the photodetector device. The measurement sub-circuit may convert an electrical current output of the photodetector device to a voltage signal.

Figure 6D:
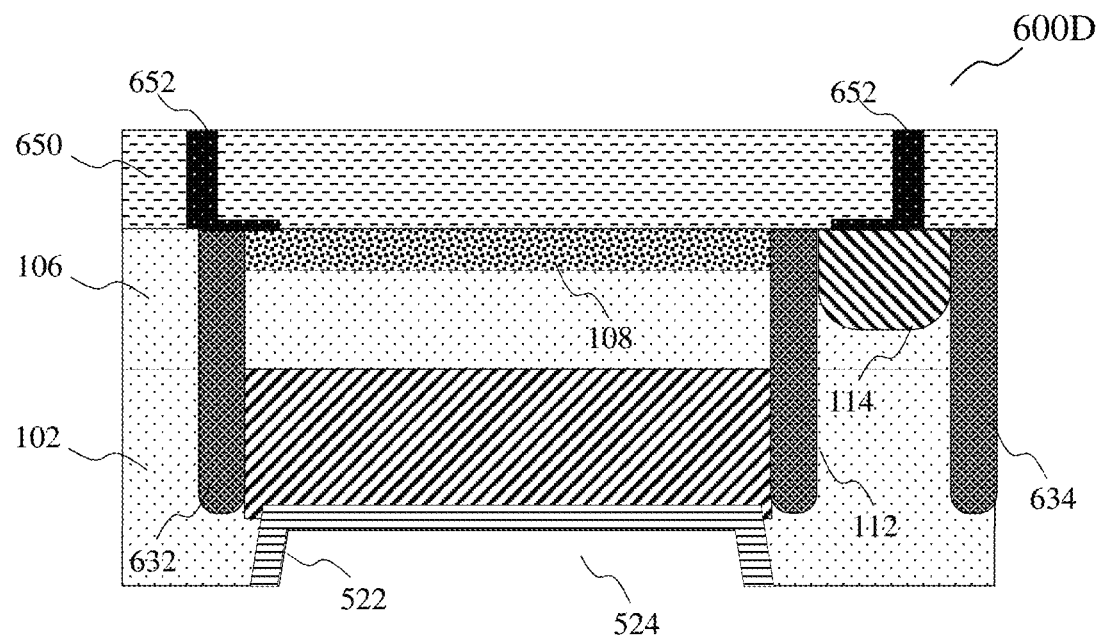

FIG. 6D shows a process 600D that may include flipping the device resulting from the process 600B, and then forming a further dielectric layer 650 over the flipped device. The further dielectric layer 650 may be arranged adjacent to the second semiconductor region 108. The process 600D may also include forming metal interconnect structures 652 in the further dielectric layer 650.

Figure 6E:
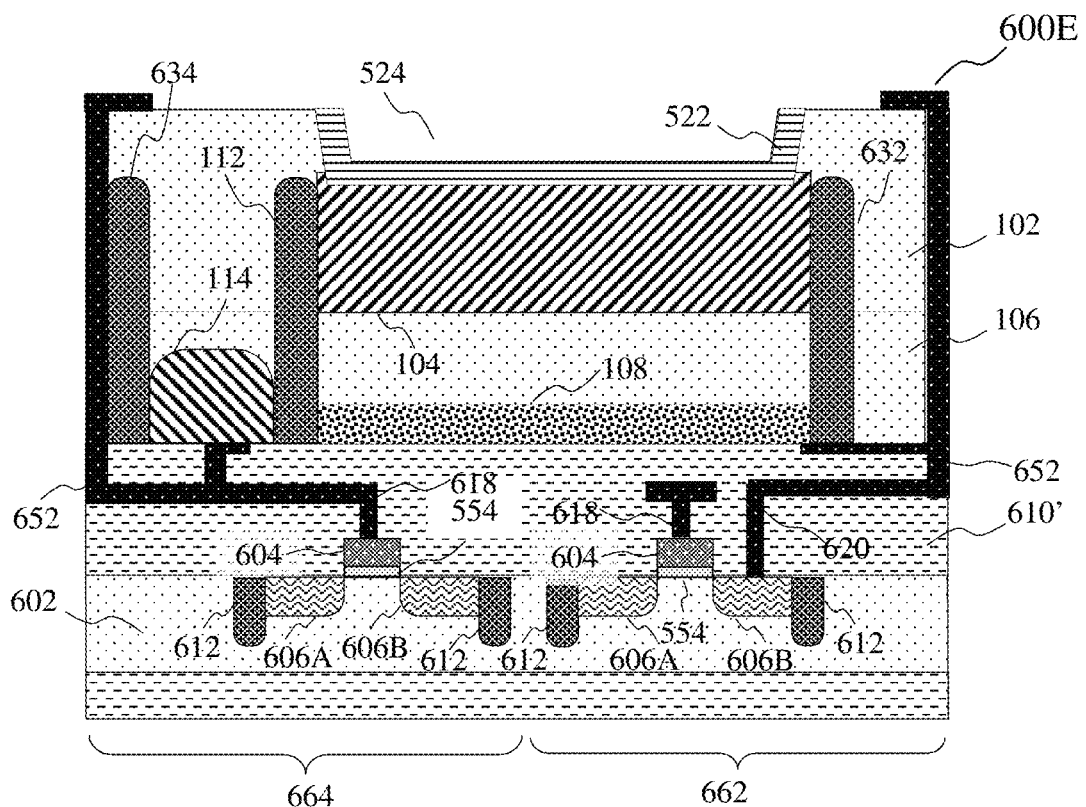

FIG. 6E shows a process 600E that may include flipping the device resulting from the process 600D and flipping the device resulting from the process 600C. The process 600E may further include bonding the two flipped devices. The further dielectric layer 650 of the device from the process 600D may be bonded to the dielectric layer 610 of the device from the process 600C, to form a combined dielectric layer 610'. Each metal interconnect structure 652 may be connected to a respective second metal contact 620 after the bonding process. The resulting device from the process 600E may be a photodetector device configured to measure illumination received in the cavity 524 at a backside of the diode device.

In the following, simulation results of a diode device according to various embodiments will be described.

Figure 7A:
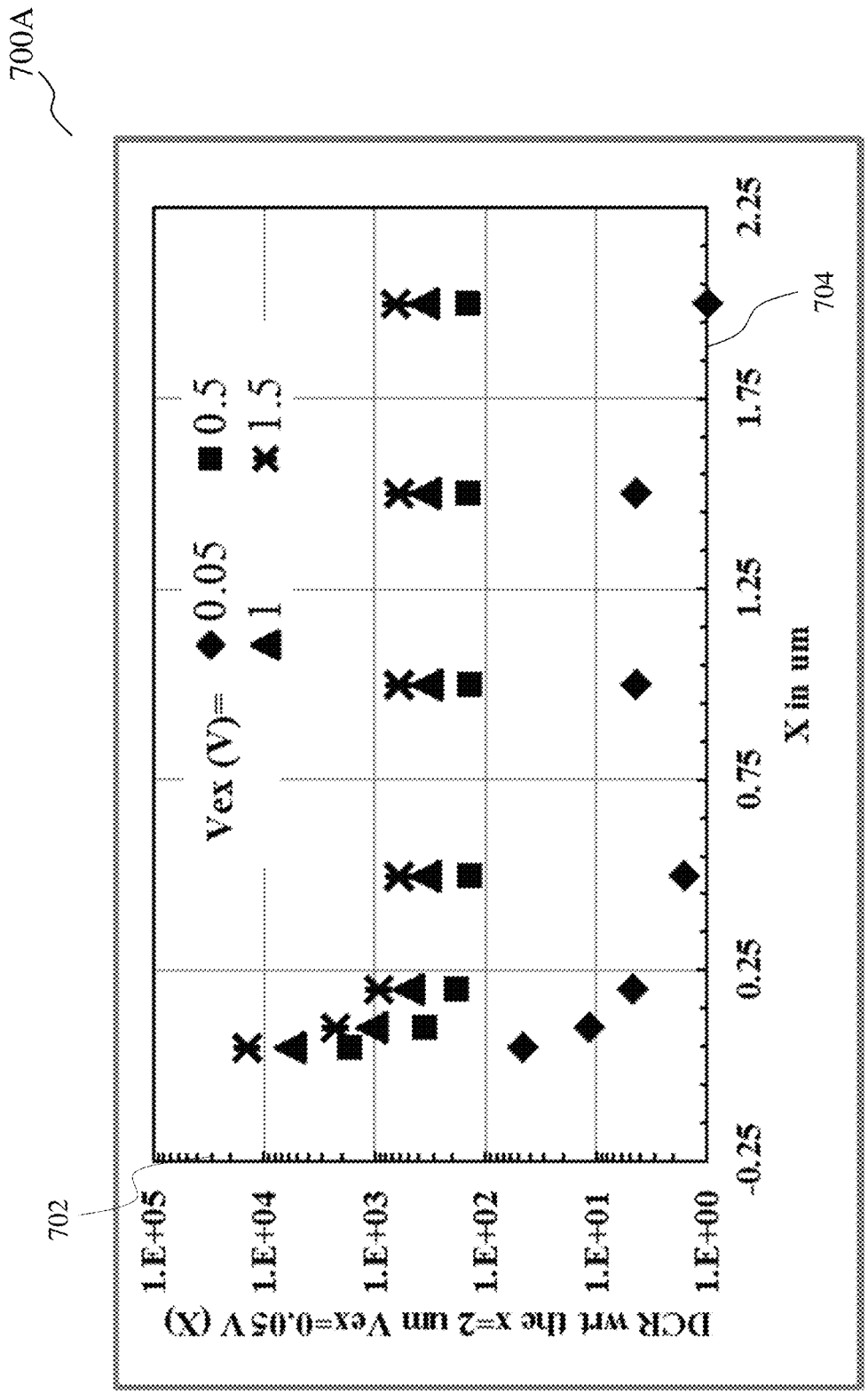
FIGS. 7A and 7B shows simulation results that demonstrates the effect of the separation distance between a p-n junction and a top of the substrate layer, on the dark count rate of a diode device according to various embodiments.
Figure 7B:
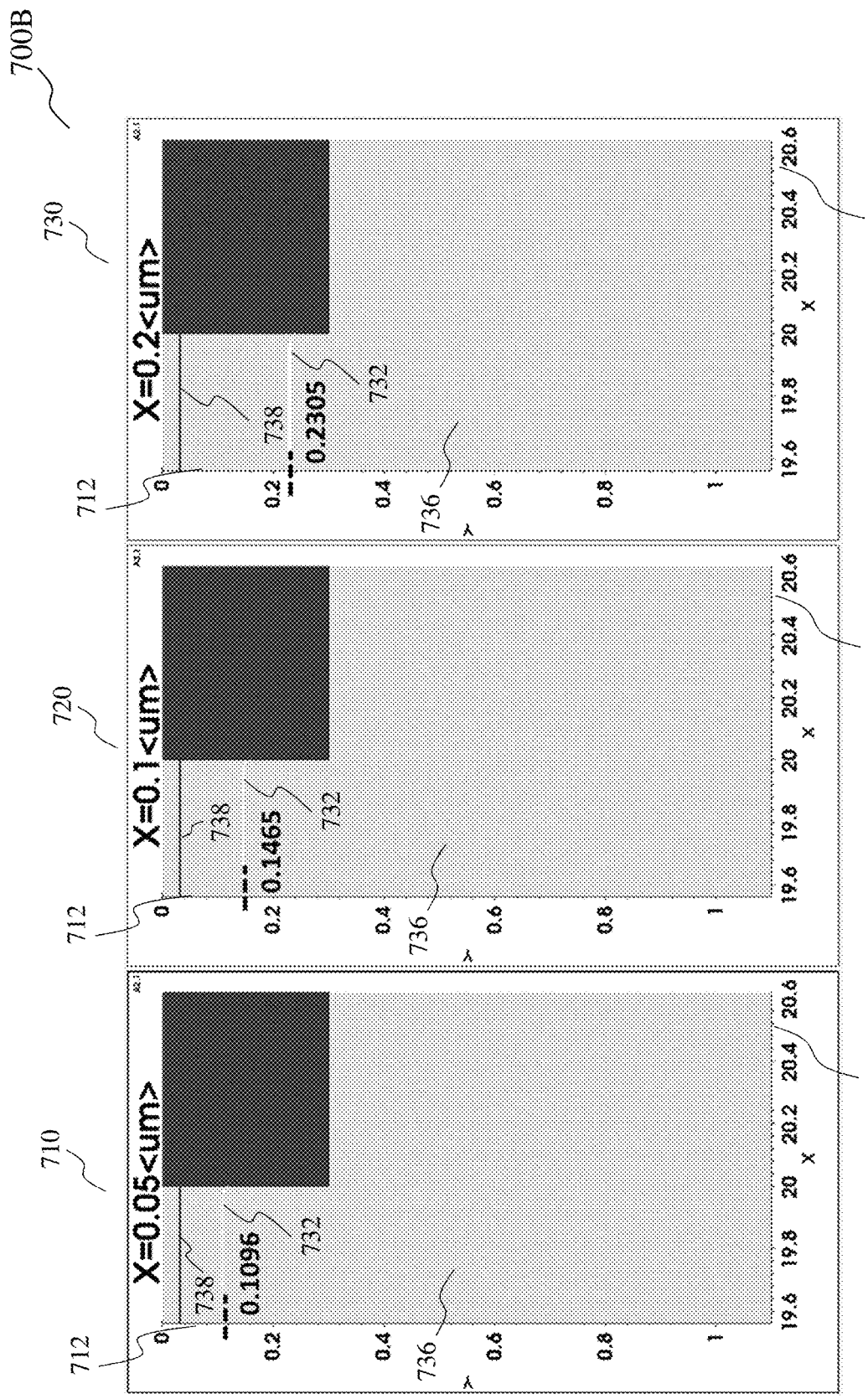

FIGS. 7A and 7B shows simulation results that demonstrates the effect of the separation distance (indicated as "X") between the p-n junction 120 and the top of the substrate layer 102, on the dark count rate of a diode device according to various embodiments. The defect density in the first semiconductor region 104 is about 1e17. The graph 700A in FIG. 7A has a vertical axis 702 indicating the dark count rate, and a horizontal axis 704 indicating the separation distance X in micrometers (μm). $V_{ex}$ denotes the excess bias voltage beyond the breakdown voltage. In other words, $V_{ex}=V_{applied}-V_{breakdown}$, where $V_{breakdown}$ is the breakdown voltage of the p-n junction 120. The graph 700A shows that the dark count rate drops as the separation distance increases. As such, a large separation distance between the p-n junction 120 and the depletion region improves the accuracy of light detection in the diode device.

FIG. 7B includes three graphs 710, 720 and 730 that each show a partial cross-sectional view of a respective diode device with a different separation distance between the p-n junction 120 and the depletion region. Each graph has a vertical axis 712 indicating a vertical distance (depth) in the diode device, and a horizontal axis 714 indicating horizontal distance (width) in the diode device. The dotted line 732 in each graph indicates the depth of the depletion region. The grey region 736 represents the first semiconductor region 104 and the substrate layer 102. The solid line 738 represents that p-n junction 120. The graph 710 shows the partial cross-sectional view of a diode device where the separation distance is 0.05 um. The graph 720 shows the partial cross-sectional view of a diode device where the separation distance is 0.1 um. The graph 730 shows the partial cross-sectional view of a diode device where the separation distance is 0.2 um.

Figure 7C:
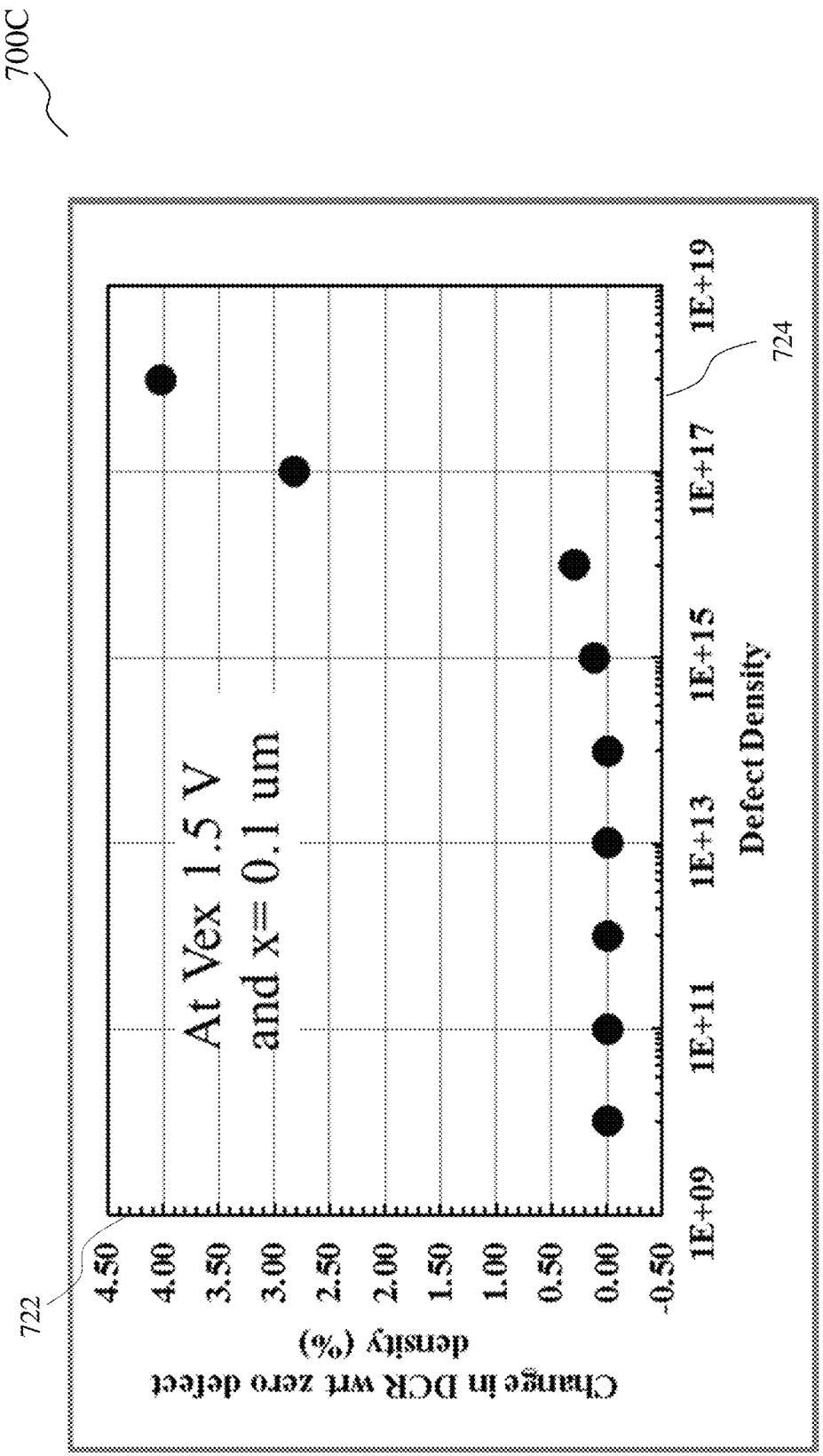
FIG. 7C shows a graph that charts the effect of defect density in the chalcogen doped region on the dark count rate of a diode device according to various embodiments.

FIG. 7C shows a graph 700C that charts the effect of defect density on the dark count rate of the diode device. The graph 700C has a vertical axis 722 indicating dark count rate, and a horizontal axis 724 indicating defect density. The graph 700C shows that the dark count rate generally increases as the defect density increases, for an analysis conducted for a separation distance of 0.05 um.

Figure 8:
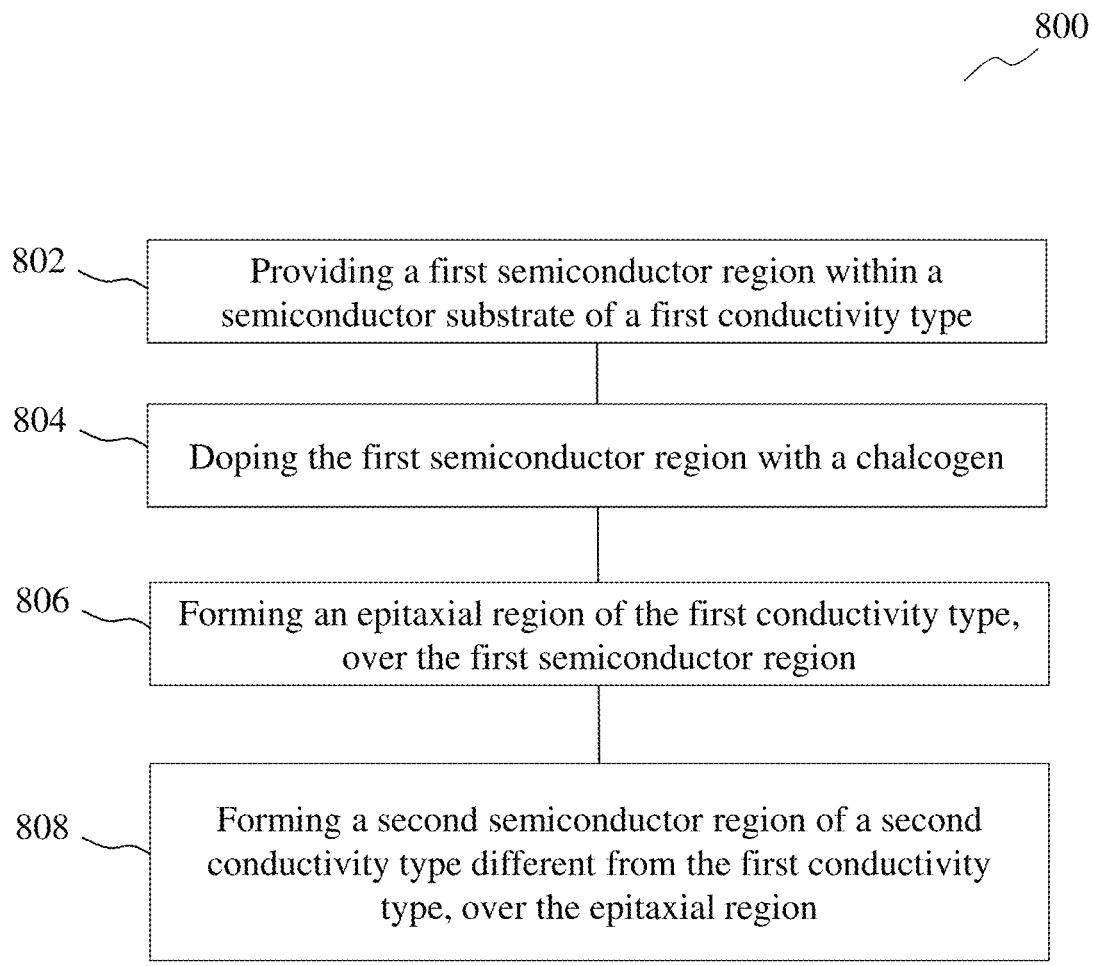
FIG. 8 shows a flow diagram of a method of forming a diode device according to various embodiments.

FIG. 8 shows a flow diagram 800 of a method of forming a diode device according to various embodiments. The method may include providing a first semiconductor region within a semiconductor substrate of a first conductivity type, in 802. The method may include doping the first semiconductor with a chalcogen, in 804. 802 and 804 may be part of the process 200B. The method may include forming an epitaxial region of the first conductivity type, over the first semiconductor region, in 806. 806 may include the process 200C. The method may include forming a second semiconductor region of a second conductivity type different from the first conductivity type, over the epitaxial region, in 808. 808 may include the process 200E. The diode device may be the diode device 100. The first semiconductor region referred to in FIG. 8 may be the first semiconductor region 104. The second semiconductor region referred to in FIG. 8 may be the second semiconductor region 108. The epitaxial region referred to in FIG. 8 may be the epitaxial region 106.

According to various embodiments, the method may further include doping the first semiconductor region to a first doping concentration and doping a top part of the epitaxial region to a second doping concentration. The second doping concentration may be different from the first doping concentration. As a result of the doping of the first semiconductor region and the epitaxial region, the first semiconductor region and the epitaxial region are configured to form a depletion region.

According to various embodiments, the method may further include forming an isolation region adjacent to each of the second semiconductor region, the epitaxial region and the first semiconductor region, for example, in the process 200D. The method may further include forming a well region of the first conductivity type, within the epitaxial region and adjacent to the isolation region, for example, in the process 200E.

According to various embodiments, the method may further include forming a further isolation region adjacent to a first side of the well region, for example in the process 500A or in the process 600A. A second side of the well region may be opposite to the first side of the well region. The second side may be adjacent to the isolation region. The method may further include forming a further well region of the second type, adjacent to the further isolation region, for example, in the process 500A. The further well region may be formed in the epitaxial region. The method may include forming a dielectric region, for example in the process 500B or in the process 600D. The dielectric region may be arranged over each of the second semiconductor region, the isolation region, the further isolation region and the well region.

According to various embodiments, the method may further include forming a cavity in the dielectric region, for example in the process 500C. The cavity may overlap the second semiconductor region.

According to various embodiments, the method may further include forming electrical interconnects within the dielectric region, for example, in the process 500B.

According to various embodiments, the method may further include forming a cavity in the semiconductor substrate, for example, in the process 600B. The cavity may overlap the second semiconductor region.

According to various embodiments, the method may further include forming electrical interconnects in a dielectric layer adjacent to the second semiconductor region, for example in the process 600D.

According to various embodiments, the method may further include bonding a wafer to the dielectric layer. The wafer may include one or more logic circuits.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A diode device comprising:
   a semiconductor substrate of a first conductivity type;
   a first semiconductor region formed within the semiconductor substrate, wherein the first semiconductor region comprises a chalcogen;
   an epitaxial region of the first conductivity type, a first part of the epitaxial region formed over the first semiconductor region;
   a second semiconductor region of a second conductivity type different from the first conductivity type, formed over the first part of the epitaxial region;
   an isolation region formed within the substrate, a first side of the isolation region arranged adjacent to each of the second semiconductor region, the first part of the epitaxial region, and the first semiconductor region; and
   a well region of the first conductivity type, formed within a second part of the epitaxial region and adjacent to a second side of the isolation region, the second side of the isolation region being opposite to the first side of the isolation region.

2. The diode device of claim 1, wherein the first semiconductor region and the first part of the epitaxial region are configured to form a depletion region when a bias voltage is applied across them.

3. The diode device of claim 1, wherein the first semiconductor region is configured to release charge carriers upon absorption of photons.

4. The diode device of claim 3, wherein the second semiconductor region is configured to release further charge carriers in response to the release of the charge carriers from the first semiconductor region.

5. The diode device of claim 1, wherein the chalcogen is one of selenium, tellurium and sulphur.

6. The diode device of claim 1, wherein the isolation region is at least partially arranged within the epitaxial region.

7. The diode device of claim 1, further comprising:
   a further isolation region adjacent to a first side of the well region, wherein a second side opposite to the first side of the well region is adjacent to the isolation region;
   a further well region of the second conductivity type, adjacent to the further isolation region; and
   a dielectric region formed over each of the second semiconductor region, the isolation region, the further isolation region, and the well region.

8. The diode device of claim 7, wherein the dielectric region has a cavity formed therein, wherein the cavity overlaps the second semiconductor region.

9. The diode device of claim 1, wherein the diode device is configured to generate a voltage in response to receiving photons incident through at least one of the second semiconductor region and the semiconductor substrate.

10. The diode device of claim 1, wherein the diode device is a single-photon avalanche diode device.

11. The diode device of claim 1, further comprises a cavity formed directly below the first semiconductor region and an anti-reflection coating formed on an inner surface of the cavity.

12. A method of forming a diode device, the method comprising:
   providing a first semiconductor region within a semiconductor substrate of a first conductivity type;
   doping the first semiconductor region with a chalcogen;
   forming an epitaxial region of the first conductivity type, including a first part of the epitaxial region over the first semiconductor region;
   forming a second semiconductor region of a second conductivity type different from the first conductivity type, over the first part of the epitaxial region;
   forming an isolation region, a first side of the isolation region adjacent to each of the second semiconductor region, the first part of the epitaxial region, and the first semiconductor region; and
   forming a well region of the first conductivity type, within a second part of the epitaxial region and adjacent to a second side of the isolation region, the second side of the isolation region being opposite to the first side of the isolation region.

13. The method of claim 12, further comprising:
   doping the first semiconductor region to a first doping concentration and doping a top part of the first part of the epitaxial region to a second doping concentration different from the first doping concentration, such that the first semiconductor region and the first part of the epitaxial region are configured to form a depletion region.

14. The method of claim 12, further comprising:
   forming a further isolation region adjacent to a first side of the well region, wherein a second side opposite to the first side of the well region is adjacent to the isolation region;
   forming a further well region of the second conductivity type, adjacent to the further isolation region; and
   forming a dielectric region, the dielectric region being arranged over each of the second semiconductor region, the isolation region, the further isolation region and the well region.

15. The method of claim 14, further comprising:
   forming a cavity in the dielectric region, wherein the cavity overlaps the second semiconductor region.

16. The method of claim 14, further comprising:
   forming electrical interconnects within the dielectric region.

17. The method of claim 12, further comprising:
   forming a cavity in the semiconductor substrate, wherein the cavity overlaps the second semiconductor region.

18. The method of claim 17, further comprising:
   forming electrical interconnects in a dielectric layer adjacent to the second semiconductor region.

19. The method of claim 18, further comprising:
   bonding a wafer comprising one or more logic circuits, to the dielectric layer.

20. The method of claim 12, further comprising forming a cavity directly below the first semiconductor region and forming an anti-reflection coating on an inner surface of the cavity.

* * * * *